(12) United States Patent
Zhu

(10) Patent No.: US 8,174,316 B2
(45) Date of Patent: May 8, 2012

(54) SWITCHING AMPLIFIER

(75) Inventor: Hao Zhu, Shanghai (CN)

(73) Assignee: Apexone Microelectronics Ltd., Shanghai (CN)

( * ) Notice: Subject to any disclaimer, the term of this patent is extended or adjusted under 35 U.S.C. 154(b) by 61 days.

(21) Appl. No.: 11/816,344

(22) PCT Filed: Oct. 18, 2006

(86) PCT No.: PCT/CN2006/002746
§ 371 (c)(1),
(2), (4) Date: Apr. 16, 2010

(87) PCT Pub. No.: WO2008/046247
PCT Pub. Date: Apr. 24, 2008

(65) Prior Publication Data
US 2010/0188150 A1    Jul. 29, 2010

(51) Int. Cl.
*H03F 3/217* (2006.01)
(52) U.S. Cl. ........................................................ 330/251
(58) Field of Classification Search .................... 330/10, 330/207 A, 251
See application file for complete search history.

(56) References Cited

U.S. PATENT DOCUMENTS

| 4,554,512 A | 11/1985 | Aiello |
| 6,476,673 B2 * | 11/2002 | Takagishi ........................ 330/10 |
| 2004/0263244 A1 | 12/2004 | Masuda et al. |

FOREIGN PATENT DOCUMENTS

EP    1 418 666 A1    12/2004

* cited by examiner

*Primary Examiner* — Steven J Mottola
(74) *Attorney, Agent, or Firm* — Fitch, Even, Tabin & Flannery, LLP

(57) ABSTRACT

A switching amplifier is disclosed and comprises: a power supply (Vcc); input circuits (Va, Vb); switch transistors (M1, M2) connected with each other in series; driving circuits (I1, I2) coupled with the switch transistors (M1, M2) respectively; a bootstrap circuit for supplying operation voltage to the driving circuit (I1). The switching amplifier also comprises: leakage circuits (M1a, M2a) or auxiliary switching circuits (M1', M2'). With the switching amplifier of the invention, the fluctuation of the bootstrap potential can be suppressed and the signal distortion of the switching amplifier can be prevented.

15 Claims, 4 Drawing Sheets

Iout=0   Iout>0   Iout<0

Iout=0    Iout>0    Iout<0

Iout=0          Iout>0          Iout<0

SWITCHING AMPLIFIER

CROSS-REFERENCE TO RELATED APPLICATION

This application is a U.S. national phase application filed under 35 U.S.C. §371 of International Application PCT/CN2006/002746, filed on Oct. 18, 2006, designating the United States, which is hereby incorporated by reference herein.

TECHNICAL FIELD

The present invention relates to a switching amplifier, more particularly, it relates to a D-type switching amplifier.

BACKGROUND ART

Currently, because no current flows in the D-type switching amplifier when there is no input signals and also because the amplifier can be rapidly turned on and off when it is switched on so that the amplifier of such type is advantageous in low energy consumption and high efficiency the D-type switching amplifier is appreciated more and more to be a switching device.

The D-type switching amplifier conventionally adopts a structure of combination of N-MOS (N-type-Metal-Oxide-Semiconductor) switch transistor and P-MOS (P-type-Metal-Oxide-Semiconductor) switch transistor. However, since a P-MOS switch tube has a defect of large area, the D-type switching amplifier of CMOS (Complementary-Metal-Oxide-Semiconductor) switch transistor is not adaptive to the minimization for the compact electronic devices. On the other hand, because N-MOS switch transistor can be used as P-MOS switch transistor, and is advantageous in small area and small turn-on resistance per unit area, the D-type switching amplifier adopts an all N-MOS switch transistor structure to replace the switch transistor structure which is based on the combination of P-MOS and N-MOS for reducing the surface area.

However, when such a structure of all N-MOS switch transistor is adopted, a gate driving voltage that is higher than the power supply of the amplifier is required in view of the source terminal of the switch transistor being connected to the power supply of the entire amplifier. For this reason, a bootstrap potential is required to be generated within the chip in order for generating an operation voltage required by the driving circuit.

A schematic diagram of a D-type switching amplifier having a driving circuit in the prior art is shown in FIG. 1. As shown in FIG. 1, Va, Vb represent the input terminals (including logic circuits, or further level conversion circuits), which receive the input pulse-width modulation (PWM) signals having reversed logic, and M1 and M2 are switch transistors or switching circuits. In order to obtain from the output terminal the pulse-width modulation signals corresponding to those at Va, Vb, it is required that the switch transistors M1 and M2 switch between turn-on and turn-off state. Wherein, the bootstrap potential Vh is generated by a bootstrap circuit, which is composed of a circuit for supplementing energy (normally, a diode Dboot), a circuit for storing the energy (capacitor Cboot), and a switch transistor M1 having the function for switching.

The switch transistors M1, M2 of the amplifier are driven by driving circuits I1, I2 respectively. Vd is the operation power supply for driving circuits I1, I2. In order to ensure that switch transistor M1 of the amplifier fully turns on, the output voltage Vout must approximate the power supply voltage Vcc, which in turn makes the driving voltage Vd be larger than the power supply voltage Vcc. This is implemented via the bootstrap potential Vh.

Meanwhile, in order to prevent both the upper and lower switch transistors M1 and M2 from being damaged because of a large current which flows directly from the power supply to the ground when the two switch transistors are turned on simultaneously, the drive logic of switch transistors M1 and M2 are set to ensure the clocks do not overlap. However, such a clock setting may lead the switch transistors in series to be turned off simultaneously. In order to prevent such happening, the delay circuits Y1, Y2 having the same delay will be added to the circuitry.

Two possible states of the current flowing when switch transistors M1, M2 are concurrently turned off in the circuit in FIG. 1 are shown in FIG. 2, wherein different current states correspond to different input signals.

As shown in FIG. 2, when current Iout exists in the inductor, it will not disappear when both switch transistors M1 and M2 are turned off simultaneously (It is referred to be a "dead zone"), rather, it flows completely through the parasitic circuit (parasitic diode D1 or D2) of switch transistor M1 or M2, thereby the "overshoot" phenomena as shown in FIG. 3 will occur when the output current Iout>0 or Iout<0. Said "overshoot" phenomena means that the output voltage Vout may be higher than the power supply voltage Vcc or lower than zero during the dead zone time due to current Iout generated by the external inductor. When Iout>0 during the dead zone time, the output voltage Vout is lower than zero, the capacitor Cboot is charged continuously and thereby the voltage Vc of the capacitor Cboot becomes larger due to the "overshoot". The turn-on resistance of the switch transistor M1 may be different according to different polarities of the output currents due to the fluctuation on the capacitor voltage Vc and thereby it leads to distortion. Wherein, the portions of the output voltage Vout, which are larger than the power supply voltage Vcc or lower than zero are called the "overshoot" voltage.

As shown in FIG. 3, Vout represents an output voltage of the amplifier; h represents the forward voltage drop of the body diodes D1, D2, that is, the depth of the "overshoot" voltage; and w is a non-overlapping time, that is, the width of the duration time of the "overshoot" voltage, also the duration time of the "dead zone".

It can be seen from FIG. 3, when Iout>0, the overshoot voltage appears to be below the waveform of the output voltage Vout; while Iout>0, the "overshoot" voltage appears to be above the waveform of the output voltage Vout. The existence of the "overshoot" voltage makes the output voltage Vout be smaller than zero when Iout>0, and thereby it makes the voltage Vc on the capacitor Cboot be "over charged" and thus become larger, and further, the unexpected fluctuation of the voltage Vout will appear to further cause the change of the turn-on resistance of the switch transistor M1 and thereby it leads to distortion.

SUMMARY OF THE INVENTION

To remove the aforesaid defects in the conventional D-type switching amplifier, the present invention provides a switching amplifier which can suppress the fluctuation of the bootstrap potential.

According to one aspect of the invention, a switching amplifier is provided and comprises: a power supply (Vcc); an input circuit having two voltage input terminals (Va, Vb) for receiving the pulse width modulation signals having reversed logic; two driving circuits (I1) and (I2) coupled with said input circuits respectively, said driving circuit (I1) being coupled between said input circuit (Va) and said power supply (Vcc), and said driving circuit (I2) being coupled between another input circuit (Vb) and the ground; switch transistors (M1, M2) coupled with said driving circuits (I1) and (I2) respectively, and connected with each other in series; a bootstrap circuit coupled with driving circuit (I1) and supplying the operation voltage to the driving circuit (I1); a discharge circuit (3) connected in parallel between the common output terminal of said switch transistors (M1, M2) and said power supply (Vcc) and a discharge circuit (3') connected in parallel between the common output terminal of said switch transistors (M1, M2) and the ground.

According to another aspect of the invention, a switching amplifier is provided and comprises: a power supply (Vcc); an input circuit having two voltage input terminals (Va, Vb) for receiving the pulse width modulation signals having reversed logic; two driving circuits (I1) and (I2) coupled with said input circuits respectively, said driving circuit (I1) being coupled between said input circuit (Va) and said power supply (Vcc), and said driving circuit (I2) being coupled between another input circuit (Vb) and the ground; switch transistors (M1, M2) coupled with said driving circuits (I1) and (I2) respectively, and connected with each other in series; an auxiliary switching circuit (M1') coupled with said switch transistor (M1); a bootstrap circuit coupled with the driving circuit (I1) and supplying the operation voltage to the driving circuit (I1); and an auxiliary switching circuit (M2') coupled with said switch transistor (M2); and wherein, said auxiliary switching circuit (M1') and said auxiliary switching circuit (M2') are connected with each other in series.

According to a further aspect of the invention, a switching amplifier is provided and comprises: a power supply (Vcc); an input circuit having two voltage input terminals (Va, Vb) for receiving pulse width modulation signals having reversed logic; two driving circuits (I1) and (I2) coupled with said input circuits respectively, said driving circuit (I1) being coupled between said input circuit (Va) and said power supply (Vcc), and said driving circuit (I2) being coupled between another input circuit (Vb) and the ground; switch transistors (M1, M2) coupled with said driving circuits (I1) and (I2) respectively, and connected with each other in series; a bootstrap circuit coupled with driving circuit (I1) and supplying the operation voltage to driving circuit (I1); said switching amplifier also comprising: an auxiliary circuit coupled with switch transistors (M1, M2) respectively, and suppressing the fluctuation of the operation voltage of the driving circuit (I1).

According to another aspect of the invention, a switching amplifier for receiving and processing the pulse-width modulation signals is provided and comprises: input terminals for receiving the pulse-width modulation signals and output terminal; switching circuits connected with each other in series for processing the pulse-width modulation signals; driving circuits coupled with the above signal input terminals and the switching circuits, and supplying the driving voltage to the switching circuit; and a bootstrap circuit coupled with the driving circuit and supplying the operation voltage to the driving circuit; said switching amplifier also comprising: an auxiliary circuit for suppressing the fluctuation of the operation voltage of the driving circuit, coupled with the said driving circuits, switching circuits, driving circuit and bootstrap circuit.

DESCRIPTION OF FIGURES

Various aspects and advantages of the invention will be fully understood after the embodiments of the invention are described in reference to the drawings, wherein.

PREFERRED EMBODIMENTS OF THE INVENTION

Figure 1:
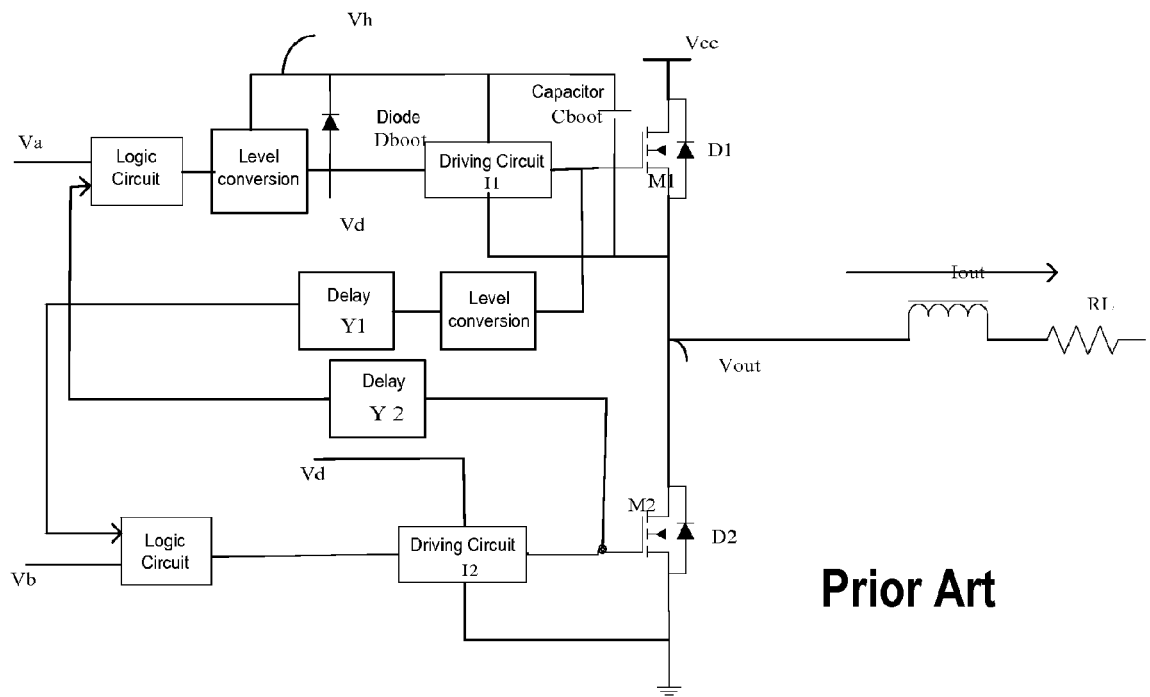
FIG. 1 is a schematic diagram showing a switching amplifier having driving circuits in the prior art.
Figure 2:
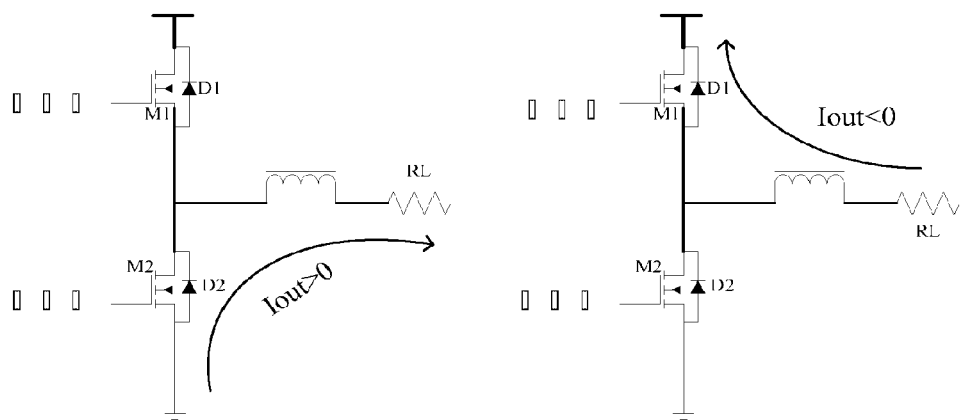
FIG. 2 illustrates a condition in which the output current Iout>0 or Iout<0 appears on the inductor when the switch transistors M1, M2 corresponding to FIG. 1 are turned off simultaneously.
Figure 3:
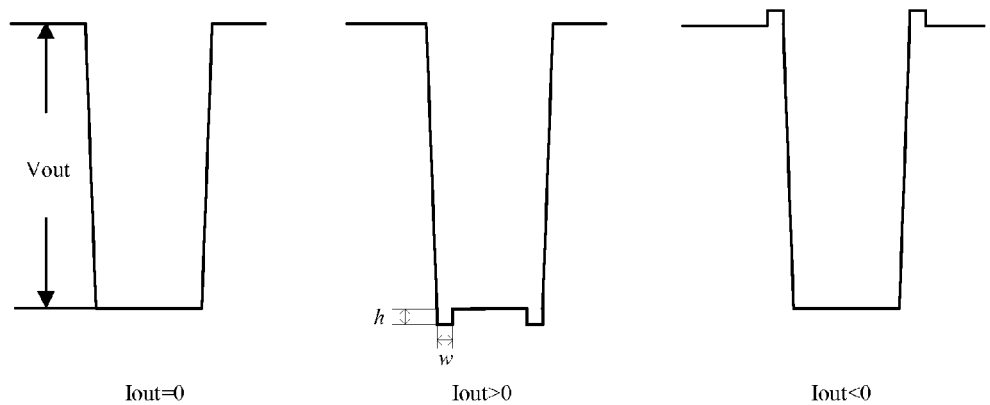
FIG. 3 is a schematic diagram illustrating the occurrence of the "overshoot" voltage and "dead zone" when the output current corresponding to FIG. 2 are I=0, Iout>0 and Iout<0.

The embodiments of the invention will be described in detail by referring to the drawings as follows. The similar structure or function will not be shown in the drawings while they are expressed by referring to the previous figure references. The drawings are used only for the readers to understand easily the embodiments of the invention, they cannot be understood as the end description of the invention or the limitation on the scope of the Claims.

Figure 4:
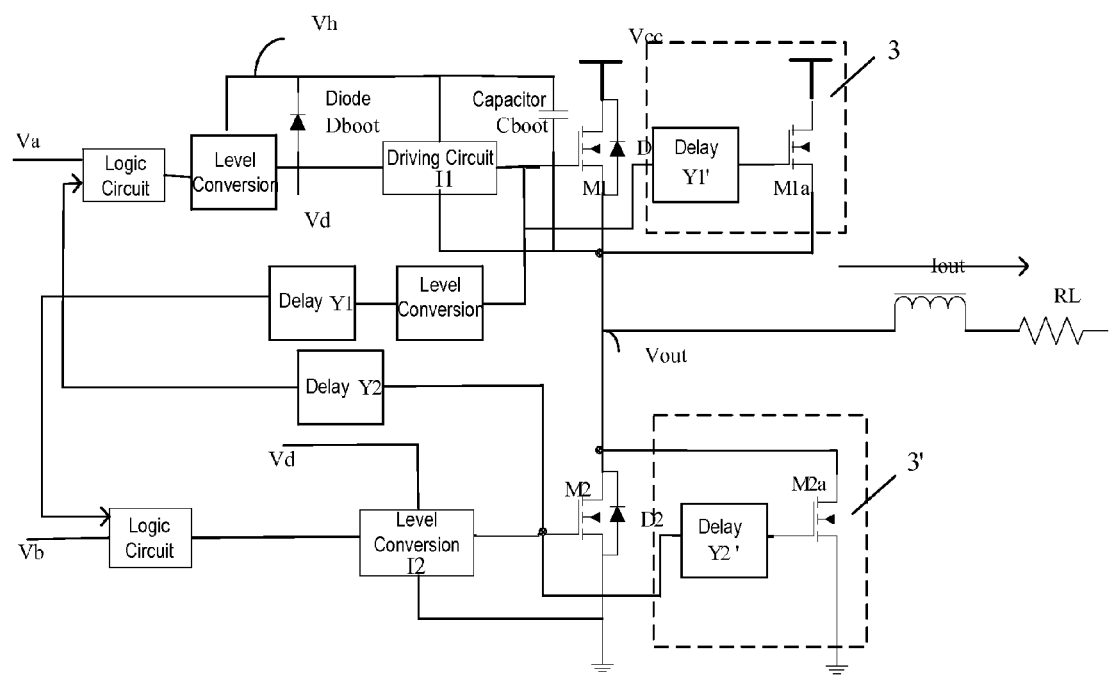
FIG. 4 is a circuit diagram of a switching amplifier having the function of suppressing the fluctuation of the bootstrap potential according to the first embodiment of the invention.

The first embodiment of the invention is shown in FIG. 4. As shown in FIG. 1, in order to suppress the signal distortion caused by the voltage "overshoot" phenomena in the original switch transistors M1 and M2, a leakage circuit, which is composed of a delay circuit and another switch transistor having a small area, is connected with the switch transistors M1, M2 in parallel respectively. Indeed, said switch transistors M1, M2 can be substituted by other switching circuits.

Specifically, a leakage circuit 3 composed of a delay circuit Y1' and a switch transistor M1a is connected with the switch transistor M1 in parallel; another leakage circuit 3' composed of a delay circuit Y2' and a switch tube M2a is connected with the switch transistor M2 in parallel, and the delay of the delay circuit Y1' and the delay circuit Y2' is less than or equal to the delay of the delay circuit Y1 and Y2 connected in front of the switch transistors M1 and M2 wherein, delay circuit Y1' and delay circuit Y2' have the same time delay. By using such a configuration, when the switch transistors M1 and M2 are both in the turn-off state, switch transistors M1a and M2a can be selectively in the turn-on state and thereby it prevents effectively the current from passing through the parasitic body diodes D1 and D2.

The specific operation states of the circuit are as follows:

(1) When switch transistor M1 is turned on but switch transistor M1a has not been turned on, the switch transistors M2 and M2a are in the turn-off state;

(2) When both switch transistors M1 and M1a are turned on, switch transistors M2 and M2a are in the turn-off state;

(3) At the moment when switch transistor M1 is turned of the switch transistor M1a is still turned on, at this time, the switch transistors M2 and M2a are still in the turn-off state;

(4) At the moment when switch transistor M1a is turned of the switch transistor M2 is in a turn-on state or in a state that it will be turned on soon. Because the existence of the delay circuit Y1', so when switch transistor M1 is turned off and switch transistor M2 has not been turned on, the duration for both switch transistors M1 and M2 becoming turning off can be shortened due to the turning-on of switch transistor M1a, and thereby the "overshoot" phenomena in the prior art because of the current flowing through M1 and M2 while both switch transistors M1 and M2 being turned off can be prevented significantly.

(5) When switch transistor M2 is turned on but switch transistor M2a has not been turned on yet, both switch transistors M1 and M1a are in the turn-off state;

(6) When both switch transistors M2 and M2a are turned on, both switch transistors M1 and M1a are in the turn-off state;

(7) At the moment when switch transistor M2 is turned off, and switch transistor M2a is still turned on, at this time, switch transistor M1 is still in the turn-off state;

(8) At the moment when switch transistor M2a is turned of switch transistor M1 is in a turn-on state or in a state that it will be turned on soon. Because the existence of the delay circuit Y2', when switch transistor M2 is turned off but switch transistor M1 has not been turned on, the duration for turning off both switch transistors M1 and M2 can be shortened due to the turn-on of switch transistor M2a, thereby the "overshoot" phenomena in the prior art because of the current flowing through M1 and M2 while both switch tubes M1 and M2 being turned off can be prevented significantly.

The above description is for an amplifier circuit operating in one cycling period. In the following cycling periods, the amplifier circuit will repeat the above operation. The operation described above is a first preferred embodiment of the invention. In practice, there may be some changes or adjustments. Various modifications of the details in the embodiment should be regarded as being within the scope of the invention.

Comparing with the prior art, the defect that the current generated in switch transistors M1, M2 because of the simultaneous turning off of switch transistors M1, M2 in the prior art can be effectively overcome by the present invention, and thereby the "overshoot" in the prior art could be effectively suppressed.

Generally, the turn-on resistances of the switch transistors M1a and M2a are less than the ratio of the forward turn-on voltage drop of parasitic body diodes D1, D2 to the output current Iout, i.e., the forward turn-on resistances of D1, D2, that is to say, the voltage drop generated by the current passing through the switch transistors M1a and M2a is less than the forward turn-on voltage drop of parasitic body diodes D1, D2.

In addition, because the area of switch transistors M1a and M2a is less than the area of switch transistors M1, M2, and switch transistors M1a and M2a can be very easily turned on or turned off, switch transistors M1 and M2a or M1a and M2 will not happen to be turned on simultaneously, thereby no power consumption will occur.

Furthermore, in order to prevent the formation of a direct path between power supply Vcc and the ground for effectively suppressing the current generated due to the simultaneous turn-off of switch transistors M1, M2, switch transistors (not shown), which are similar with switch transistors M1a and M2a and have a delay earlier than that of switch transistors M1a and M2a but later than that of switch transistors M1, M2, can be respectively connected with switch transistors M1, M2 in parallel. By adopting such a configuration, the voltage fluctuation of the switching amplifier can be further suppressed and an apparent inventive effect can thus be provided.

Figure 5:
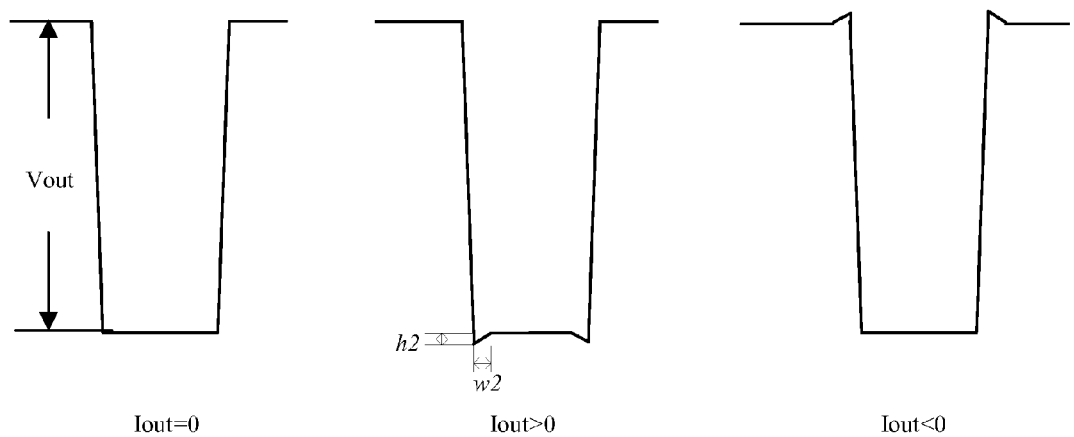
FIG. 5 shows the waveforms of the output voltage (Vout) of the switching amplifier according to the first embodiment shown in FIG. 4 where the output current being I=0, I>0, and I<0.

The waveforms of output voltage Vout of the switching amplifier in the present embodiment where I=0, I>0 and I<0 are shown in FIG. 5. It can be seen from the figure that the "overshoot" of output voltage Vout is significantly reduced, and the "dead zone" period is significantly shortened. It is noted that the depth of the "overshoot" voltage depends on the turn-on voltage drop on switch transistor M1a. If the charging time of the diode is considered, than the voltage Vc on the capacitor Cboot can be considered to have almost no fluctuation.

Figure 6:
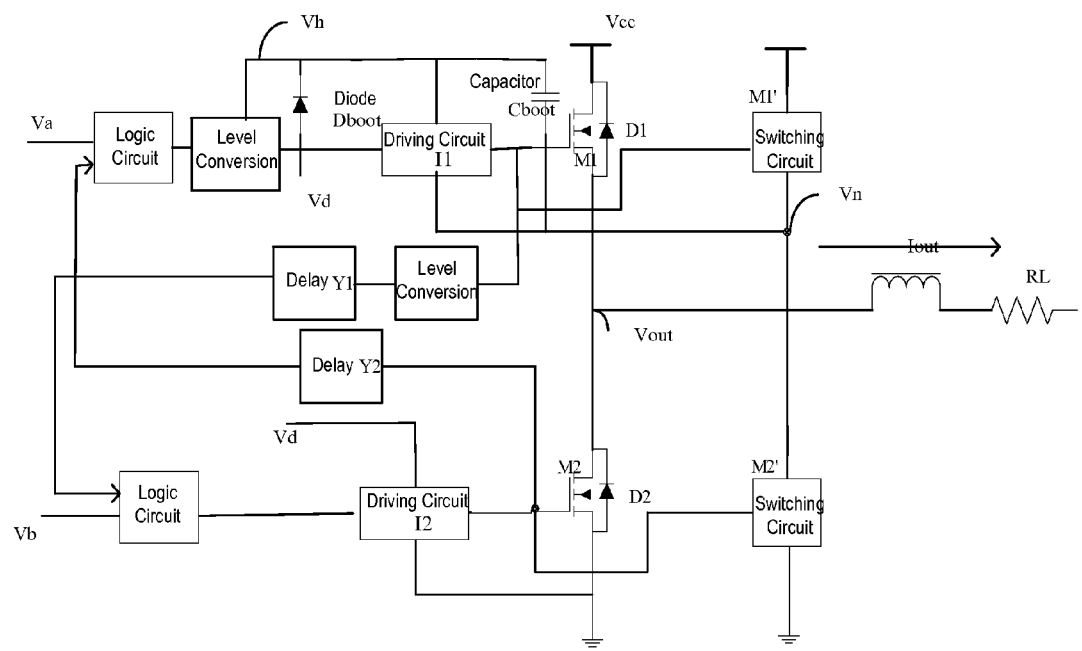
FIG. 6 is a circuit diagram of a switching amplifier having the function of suppressing the fluctuation of the bootstrap potential according to the second embodiment of the invention.

A switching amplifier having the function of suppressing the fluctuation of the bootstrap potential according to the second embodiment of the invention is shown in FIG. 6. The difference between this one and the embodiment shown in FIG. 4 is that the generation of the bootstrap potential in the second embodiment does not depend on the switch transistors (or switching circuits) M1, but instead the voltage reference point of the bootstrap potential is generated by M1' and M2', which are two auxiliary switch transistors or auxiliary switching circuits having smaller area and are used to substitute M1 and M2. Specifically, the bootstrap potential is established mainly by switch transistor M1', the diode Dboot and the capacitor Cboot.

The actual operations are as follows:

(1) When switch transistors M1, M1' are turned off but switch transistors M2, M2' are turned on, both of the voltage Vn on switch transistor M1' and the output voltage Vout are zero. The drive voltage Vd charges the capacitor Cboot via diode Dboot, and the maximum voltage difference on the capacitor Cboot is Vd−Ve, wherein Ve is the forward turn-on voltage of the diode Dboot;

(2) When all of switch transistors M1, M1', M2, M2' are turned off, an "overshoot" may appear on output voltage Vout, while voltage Vn is still zero due to the turn-off of both switch transistors M1' and M2';

(3) When switch transistors M1, M1' are turned on and the switch transistors M2, M2' are turned off, the values of Vn and Vout increase to the value of power supply voltage Vcc. However, Vh is equal to Vout+Vc, wherein Vc is the voltage value on the capacitor Cboot. At this time, Vh is larger than Vd. Thus, no current flows through the diode Dboot;

(4) When switch transistors M1, M1' are turned off again, and switch transistors M2, M2' are also turned off, the voltage Vn on switch transistor M1' increases to the value of the power supply voltage Vcc, an "overshoot" will appear on the output voltage Vout.

During this procedure, the capacitor voltage Vc does not relate to the voltage Vout, it only relates to the voltage Vn of switch transistor M1'. Therefore, the "overshoot" appearing on the output voltage Vout will not lead to the fluctuation of the capacitor voltage Vc, and the "overshoot" will not appear on Vn. Therefore, by using auxiliary switch transistors M1' and M2' of the second embodiment, the fluctuation on the capacitor voltage Vc will not occur during the entire procedure and it will not lead to the distortion of the signal of the amplifier.

The operation procedure described above is a preferred operation state in the second embodiment of the invention. During the practical application, changes and adjustments should be considered. Various modifications on the details of the embodiment are all included in the scope of the present invention.

Figure 7:
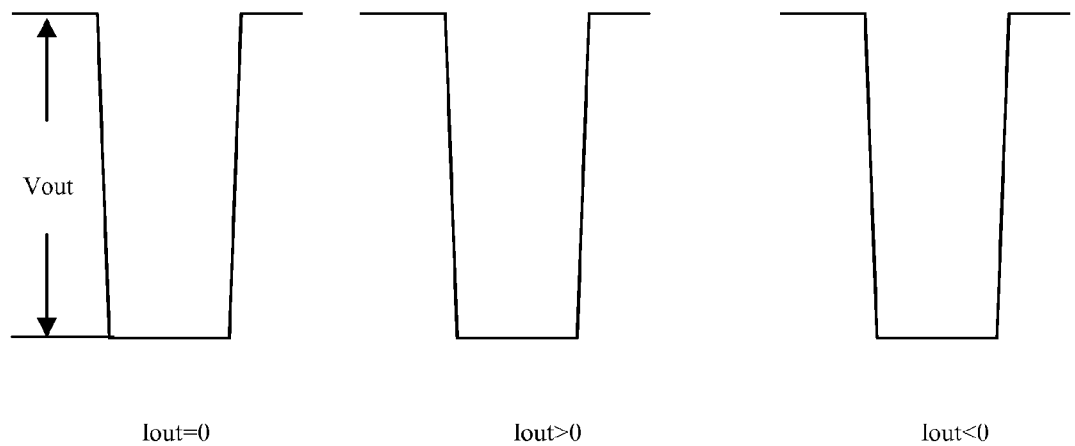
FIG. 7 shows the waveforms of the voltage (Vn) of the switching amplifier having the function of suppressing the fluctuation of the bootstrap potential according to the second embodiment shown in FIG. 6 where the output current being I=0, I>0, and I<0.

It can be seen from FIG. 7, when Iout=0, Iout<0, Iout>0, the "overshoot" voltage and "dead zone" can hardly be produced by the output voltage Vn of auxiliary switch transistor M1' in the second embodiment shown in FIG. 6.

Figure 8:
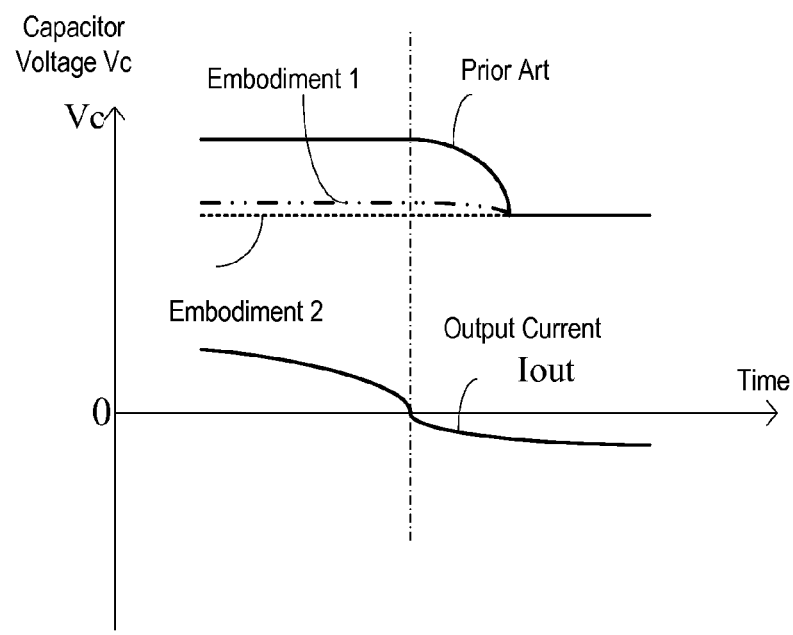
FIG. 8 shows a comparison of the changes of the capacitor voltage (Vc) between the switch tubes used in the first embodiment and the second embodiment of the invention and the switching amplifier in the prior art when the output current (Iout) varies.

A comparison between the switching circuits in the first embodiment and the second embodiment of the invention and the switch transistor in the prior art is shown in FIG. 8, it shows the changes of the capacitor voltage Vc while the output current changing.

It can be seen from the drawing, when Iout=0, Iout<0, Iout>0, the output current Iout changes over time. It can be found that the voltage value Vc on the capacitor Cboot may generate large fluctuation in the prior art and thereby it will leads to large signal distortion. The fluctuation in the first embodiment of the invention is rather small, while it causes substantially no fluctuation in the second embodiment.

It is noted that in the embodiments of the invention, driving circuits I1, I2 of switch transistors M1, M2, or M1', M2' can be composed of inverters or other circuits that can implement the drive function. In the embodiments of the invention, the bootstrap circuit for supplying the operation voltage to the switch transistor driving circuit I1 comprises an energy supplementary circuit and an energy storing circuit, wherein the energy supplementary circuit in the invention is a diode Dboot, of course, it can also be other switching circuits that can implement the function for supplementing the energy. And the energy storing circuit in the invention employs a capacitor Cboot.

Furthermore, it can be understood by those skilled in the ordinary technology of the art, the switch transistors in the first and second embodiments of the invention can be any switch transistor which is composed of transistors or N-channel-Metal-Oxide-Semiconductor. Said switch transistor can also be other switching circuits that can implement the same switching function.

The voltage fluctuation of the bootstrap potential generated during the operation of the amplifier is suppressed effectively in the invention by adding to the switching amplifier circuit an auxiliary circuit which comprises leakage circuits 3, 3' of the first embodiment, and the auxiliary switching circuits M1' and M2' of the second embodiment, thereby the signal distortion of the entire amplifier can be effectively prevented during the application procedure.

In the above description, it has been described in detail the switching amplifier having the function of suppressing the fluctuation of the bootstrap potential in the invention. However, it can be understood by those skilled in the ordinary technology of the art, that various modifications can be made to the details of the above embodiments without departing the spirit of the invention. Various variations are allowed. All of the modifications and variations will fall within the scope defined by the Claims of the invention.

What is claimed is:

1. A switching amplifier comprising:
   a power supply (Vcc);
   an input circuit having first and second voltage input terminals (Va, Vb) for receiving pulse width modulation signals having opposite logic;
   a first driving circuit (I1) and a second driving circuit (I2) coupled with the first and second voltage input terminals of said input circuit respectively, said first driving circuit (I1) being coupled between said input circuit first voltage input terminal (Va) and said power supply (Vcc), and said second driving circuit (I2) being coupled between said input circuit first voltage input terminal (Vb) and the ground;
   switch transistors (M1, M2) which are coupled with said first and second driving circuits (I1) and (I2) respectively, and connected with each other in series;
   a bootstrap circuit coupled with the first driving circuit (I1) and supplying the operation voltage to the first driving circuit (I1);
   a leakage circuit (3) connected in parallel between the common output terminal of said switch transistors (M1, M2) and said power supply (Vcc); and
   a leakage circuit (3') connected in parallel between the common output terminal of said switch transistors (M1, M2) and the ground.

2. The switching amplifier as claimed in claim 1, wherein said first driving circuit (I1) and said second driving circuit (I2) are coupled with the input terminals (Va, Vb) of said input circuit via a delay circuit (Y1) and a delay circuit (Y2) respectively.

3. The switching amplifier as claimed in claim 1, wherein said leakage circuit (3) is composed of a delay circuit (Y1') and a switch transistor (M1a), and said leakage circuit (3') is composed of a delay circuit (Y2') and a switch transistor (M2a).

4. The switching amplifier as claimed in claim 3, wherein the delay of said delay circuit (Y1') is less than or equal to the delay of said delay circuit (Y1), and the delay of said delay circuit (Y2') is less than or equal to the delay of said delay circuit (Y2), and the delay of said delay circuit (Y1') is equal to the delay of said delay circuit (Y2'), and the areas of said switch transistors (M1a, M2a) are less than the areas of said switch transistors (M1, M2) respectively.

5. The switching amplifier as claimed in claim 1, wherein said bootstrap circuit comprises an energy supplementary circuit having a diode (Dboot), an energy storing circuit having a capacitor (Cboot), and a switching circuit having a switch transistor (M1).

6. The switching amplifier as claimed in claim 1, wherein said first and second driving circuits (I1) and (I2) are composed of one or more inverters.

7. The switching amplifier as claimed in any of previous claims, wherein said switch transistors (M1, M2, M1a, M2a) are N-channel-Metal-Oxide transistors.

8. A switching amplifier comprising:
   a power supply (Vcc);
   an input circuit having first and second voltage input terminals (Va, Vb) for receiving pulse width modulation signals having opposite logic;
   a first driving circuit (I1) and a second driving circuit (I2) coupled with said first and second voltage input terminals of the input circuit respectively, said first driving circuit (I1) being coupled between said input circuit first voltage input terminal (Va) and said power supply (Vcc), and said second driving circuit (I2) being coupled between said input circuit second voltage input terminal (Vb) and the ground;
   switch transistors (M1, M2) coupled with said first and second driving circuits (I1) and (I2) respectively, and connected with each other in series;
   an auxiliary switching circuit (M1') coupled with said switch transistor (M1);
   a bootstrap circuit coupled with the first driving circuit (I1) and supplying the operation voltage to the first driving circuit (I1); and an auxiliary switching circuit (M2') coupled with said switch transistor (M2), and wherein said auxiliary switching circuit (M1') and said auxiliary switching circuit (M2') are connected with each other in series.

9. The switching amplifier as claimed in claim 8, wherein said first and second driving circuits (I1) and (I2) are composed of one or more inverters.

10. The switching amplifier as claimed in claim 8, wherein said bootstrap circuit comprises an energy supplementary circuit having a diode (Dboot), an energy storing circuit having a capacitor (Cboot), and an auxiliary switching circuit (M1').

11. The switching amplifier as claimed in claim 8, wherein said switch transistors (M1, M2) and said auxiliary switching circuits (M1', M2') are composed of N-channel-Metal-Oxide transistors.

12. A switching amplifier comprising:
a power supply (Vcc);
an input circuit having first and second voltage input terminals (Va, Vb) for receiving pulse width modulation signals having opposite logic;
first and second driving circuits (I1) and (I2) coupled with said first and second voltage input terminals of the input circuit respectively, said first driving circuit (I1) being coupled between said input circuit first voltage input terminal (Va) and said power supply (Vcc), and said second driving circuit (I2) being coupled between said input circuit second voltage input terminal (Vb) and the ground, wherein said first driving circuit (I1) and said second driving circuit (I2) are coupled with the input terminals (Va, Vb) of said input circuit via a delay circuit (Y1) and a delay circuit (Y2) respectively, and said first and second driving circuits (I1) and (I2) are composed of one or more inverters;
switch transistors (M1, M2) coupled with said first and second driving circuits (I1) and (I2) respectively, and connected with each other in series;
a bootstrap circuit coupled with the first driving circuit (I1) and supplying the operation voltage to the first driving circuit (I1);
said switching amplifier further comprising:
an auxiliary circuit coupled with said switch transistors (M1, M2) respectively, and adaptive to suppress the fluctuation of the operation voltage of the first driving circuit (I1).

13. The switching amplifier as claimed in claim 12, wherein said auxiliary circuits are leakage circuits (3, 3') which are connected in parallel with the switch transistors (M1, M2), and said leakage circuit (3) is composed of a delay circuit (Y1') and a switch transistor (M1a), and said leakage circuit (3') is composed of a delay circuit (Y2') and a switch transistor (M2a).

14. The switching amplifier as claimed in claim 12, wherein the delay of said delay circuit (Y1') is less than or equal to the delay of said delay circuit (Y1), and the delay of said delay circuit (Y2') is less than or equal to the delay of said delay circuit (Y2), and the delay of said delay circuit (Y1') is equal to the delay of said delay circuit (Y2'), the areas of said switch transistors (M1a, M2a) are less than the areas of said switch transistors (M1, M2) respectively.

15. The switching amplifier as claimed in claim 12, wherein said auxiliary circuit is auxiliary switching circuits (M1', M2'), which are connected with each other in series.

* * * * *